United States Patent
Jayaraj et al.

(10) Patent No.: US 6,320,257 B1
(45) Date of Patent: *Nov. 20, 2001

(54) CHIP PACKAGING TECHNIQUE

(75) Inventors: Kumaraswamy Jayaraj, Foxboro, MA (US); Thomas E. Noll, Derry, NH (US); Harry F. Lockwood, Waban, MA (US)

(73) Assignee: Foster-Miller, Inc., Waltham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/312,862

(22) Filed: Sep. 27, 1994

(51) Int. Cl.$^7$ .................................................. H01L 23/34
(52) U.S. Cl. ........................... 257/723; 257/717; 257/778
(58) Field of Search ..................................... 257/723, 686, 257/778, 724, 680, 717; 428/209

(56) References Cited

U.S. PATENT DOCUMENTS

| | | | |
|---|---|---|---|
| 4,783,695 | * 11/1988 | Eichelberger | 257/723 |
| 4,975,312 | * 12/1990 | Lusignea et al. | 428/209 |
| 5,016,138 | * 5/1991 | Woodman | 257/686 |
| 5,306,948 | 4/1994 | Yamada et al. | |
| 5,394,490 | * 2/1995 | Kato et al. | 257/778 |
| 5,596,171 | * 1/1997 | Harris et al. | 257/704 |

FOREIGN PATENT DOCUMENTS

| | | |
|---|---|---|
| 0 139 924 | 5/1985 | (EP) . |
| 0 457 313 | 11/1991 | (EP) . |
| 0 478 188 | 4/1992 | (EP) . |
| 491161 | * 6/1992 | (EP) . |
| 0 509 825 | 10/1992 | (EP) . |
| 0 525 651 | 2/1993 | (EP) . |
| 0 615 289 | 9/1994 | (EP) . |
| 4-73955 | * 3/1992 | (JP) . |
| 5-109952 | * 4/1993 | (JP) . |

OTHER PUBLICATIONS

IBM Technical Disclosure Bulletin, vol. 31, No. 8, Jan. 1989, New York, US, pp. 135–138, "Thin Film Module".
IBM Technical Disclosure Bulletin, vol. 36, No. 12, Dec. 1993, New York, US, p. 669, "Optical Flex Interconnect to Multi–Chip Modules".
IBM Technical Disclosure Bulletin, vol. 25, No. 4, Sep. 1982 New York, US, pp. 1954–1956, J. C. Edwards, "Chip Attachment to Tape and Cable".

5th ICEEE/ICWSI, San Francisco, USA, Jan. 20–22, 1993, R.J. Woinarowski et al., "Three Dimensional Hybrid Wafer Scale Integration Using the GE High Density Interconnect Technology", pp. 309–317.

* cited by examiner

Primary Examiner—Roy Potter

(57) ABSTRACT

A hermetically sealed package for at least one semiconductor chip is provided which is formed of a substrate having electrical interconnects thereon to which the semiconductor chips are selectively bonded, and a lid which preferably functions as a heat sink, with a hermetic seal being formed around the chips between the substrate and the heat sink. The substrate is either formed of or includes a layer of a thermoplastic material having low moisture permeability which material is preferably a liquid crystal polymer (LCP) and is a multiaxially oriented LCP material for preferred embodiments. Where the lid is a heat sink, the heat sink is formed of a material having high thermal conductivity and preferably a coefficient of thermal expansion which substantially matches that of the chip. A hermetic bond is formed between the side of each chip opposite that connected to the substrate and the heat sink. The thermal bond between the substrate and the lid/heat sink may be a pinched seal or may be provided, for example by an LCP frame which is hermetically bonded or sealed on one side to the substrate and on the other side to the lid/heat sink. The chips may operate in the RF or microwave bands with suitable interconnects on the substrate and the chips may also include optical components with optical fibers being sealed into the substrate and aligned with corresponding optical components to transmit light in at least one direction. A plurality of packages may be physically and electrically connected together in a stack to form a 3D array.

27 Claims, 8 Drawing Sheets

CHIP PACKAGING TECHNIQUE

STATEMENT OF GOVERNMENT INTEREST

The present invention was developed under Government Contract Nos. F29601-93-C-0081 and DAAH01-91-C-R009 and funding for this invention was obtained from the Government of the United States by virtue of Contract No. NAS7-1273 from NASA-JPL.

FIELD OF THE INVENTION

This invention relates to chip packaging techniques and in particular to multichip modules (MCM) and to a new technique for the fabrication thereof. More particularly, the invention relates to packaging techniques for semiconductor chips, including microwave/RF chips and optical chips, and for the formation of 3D arrays.

BACKGROUND OF THE INVENTION

Multichip packaging approaches (MCP) or multichip modules (MCM) are known to provide significant performance enhancements over single chip packaging approaches. In MCP, several bare semiconductor chips (ICs) are mounted and interconnected on a common substrate through very high density interconnects. Advantages of this approach include a significant reduction in the overall size and weight of the package, which directly translates into reduced system size. Thus, first level advantages include:

1. Higher silicon packaging density—about a factor of 4 compared to surface mounted ICs on a printed wiring board (PWB).
2. Short chip-to-chip interconnections—at least a factor of two reduction in interconnect links.
3. Low dielectric constant materials—about three compared to nine for alumina and four to five for PWB materials.
4. Higher wiring density.

These benefits lead to the following secondary benefits:
1) increased system speed.
2) Increased reliability.
3) Reduced weight and volume.
4) Reduced power consumption (a factor of 4) for the same level of performance.
5) Reduced heat to be dissipated for the same level of performance.

While there are a number of currently utilized MCP approaches, existing MCP approaches suffer from at least one of the following two significant limitations. First, all such approaches require a hermetic package to protect the ICs. This is typically a metal or ceramic casing which encapsulates and seals the MCP/MCM to protect against both stray electrical fields and to protect it against environmental factors such as water vapor and gases.

The second limitation for most existing approaches is that the area beneath the ICs is shared both for electrical routing and heat removal. This results in some sharing of electrical and thermal paths, causing a thermal performance penalty. The thermal performance penalty results in the ICs operating at higher temperatures, thereby reducing the lifetime of the ICs. This reduces the reliability of systems in which the MCPs are utilized and increases the maintenance cost of such systems.

A need therefore exists for an improved MCP approach which achieves the electrical and environmental protection of the chips without the cost, size and weight disadvantages of an extra hermetic package and which eliminates the thermal performance penalty associated with the same area beneath the ICs being used for both electrical routing and heat removal.

Similar problems to those described above arise when packaging a single chip, when packaging microwave or RF components and when packaging optical components. A particular problem with the latter types of components is bringing output leads, for example transmission lines or optical fibers, through the side wall of the MCM package containing the optical and/or electrical devices. For example, with optical fibers, glass frits with ceramics and metal are utilized to seal around the fiber to retain the desired moisture and environmental protection. This is, however, an expensive process due to the cost of the materials as well as the labor involved. The heat involved in forming the glass seal also presents the risk of damaging electronic devices within the package during assembly. This sealing technique also has the disadvantage of making the part bulky and heavy, limiting its desirability for avionics and space applications. While attempts have been made to encapsulate fibers in ordinary polymers, such polymers do not provide a barrier to moisture, have limited structural integrity and coefficients of thermal expansion (CTE) which are high enough, and differ enough from that of the glass fibers as to create thermal cycling stresses. This reduces yields during assembly and adversely affects the long term reliability of the packages. The poor moisture barrier properties and poor mechanical properties also adversely affect the yield and reliability of the resulting packages. It is also important that the sealing technique utilized not cause mechanical stresses during packaging assembly since this can cause misalignment of fibers previously aligned, for example passively aligned, with corresponding devices. Such loss of alignment can adversely affect the performance and reliability of the device and can increase costs by adversely impacting the yield of usable devices. A need therefore exists for an improved technique for packaging devices having optical fibers or other information carrying leads exiting therefrom, which technique provides a good, thermally stable seal and moisture barrier.

SUMMARY OF THE INVENTION

In accordance with the above, this invention provides a package for at least one semiconductor chip and a method for the fabrication thereof which involves a substrate which includes at least a layer of a thermoplastic material having low moisture permeability, electrical interconnects formed on the substrate, at least one semiconductor chip bonded to selected ones of the electrical interconnects, a lid which preferably functions as a heat sink, and a hermetic seal formed around the chips between the substrate and the heat sink. Where the lid is a heat sink, it is preferably formed of a material having a high thermal conductivity and a coefficient of thermal expansion which substantially matches that of the chip and a thermal bond is formed between the side of each chip opposite that connected to the substrate and the heat sink. The thermoplastic material of the substrate is preferably a liquid crystal polymer (LCP) and the heat sink may also be formed at least in part of an LCP.

For some embodiments, the heat sink is a printed wiring board (PWB) which for at least one embodiment includes a cold-plate sandwiched between a pair of LCP layers, and thermal conduction pads extending from each thermal bond through an adjacent LCP layer to the cold-plate. The seal formed between the substrate and the heat sink may be a pinch seal. Where the heat sink is a PWB having electrical wiring thereon, electrical connections may be provided between the interconnects on the substrate and the electrical wiring on the PWB. For one embodiment, the substrate is of a material not having low moisture permeability, with a layer of LCP or other low moisture permeability thermoplastic coated or otherwise formed over the substrate and sealed to the lid.

Alternatively, the seal between the substrate and the heat sink may include at least one LCP interconnect element or frame between the substrate and the heat sink, with a seal being formed between the interconnect element or frame and the substrate and a seal being formed between the interconnect element and the heat sink. Where the chips have a signal conducting element such as a optical fiber array/bundle exiting therefrom, such signal conducting element may pass through and be sealed in the interconnect element. The heat sink is preferably formed of a material having a coefficient of thermal expansion (CTE) of two to ten ppm/C°, this material being for example a metal matrix composite or a polymer matrix composite. The heat sink may be formed of a machinable material which is bent to form a cavity in which the chips fit, with the edges of the heat sink being sealed to the substrate.

For preferred embodiments, the LCP is a multi-axially oriented material, for example Vectra™ or Xydar™. The chips may operate in the RF or microwave bands with the interconnects on the substrate being controlled impedance interconnects suitable for operation in the frequency band of the chips. The chips may also include optical components, either in addition to or instead of other components, with optical fibers being sealed into the substrate and aligned with corresponding optical component to transmit light in at least one direction to and from the component. The components may, for example, be optical detectors or optical emitters such as lasers.

A plurality of packages may be physically and electrically connected together in a stack to form a 3D array. In particular, each of the stacked packages may have an overhang with the overhangs of adjacent packages being physically connected by a heat seal, adhesive, clamp, screws or other suitable means. In particular, plated through holes may be formed in the overhang for making electrical connections between packages. For a preferred embodiment, the electrical paths through the substrates and the thermal paths through the heat sinks are at 90° to each other.

The foregoing and other objects, features and advantages of the invention will be apparent from the following more particular description of preferred embodiments of the invention as illustrated in the accompanying drawings.

IN THE DRAWINGS

DETAILED DESCRIPTION

Figure 1A:
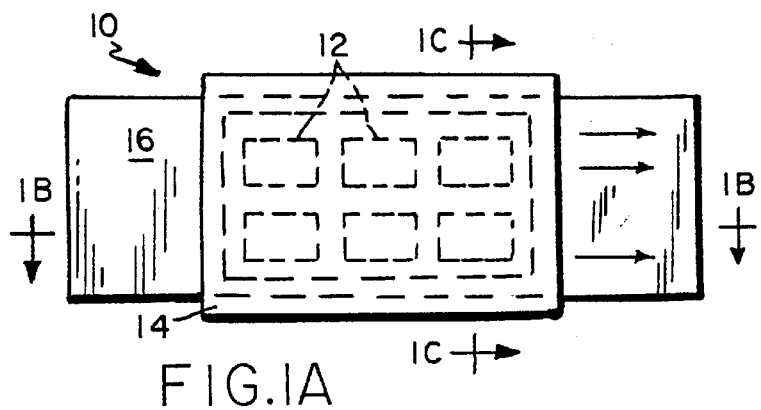
FIG. 1A is a top view of a basic multichip package in accordance with the teachings of this invention.
Figure 1B:
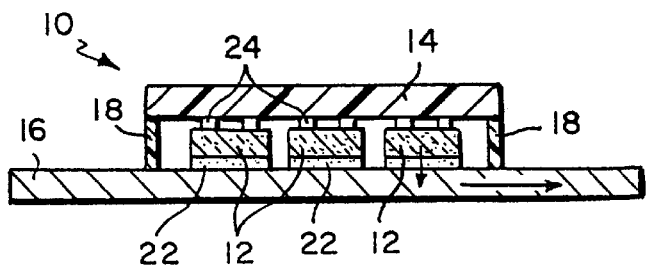
FIGS. 1B and 1C are cross-sections of the package shown in FIG. 1A taken along the lines B—B and C—C, respectively.
Figure 1C:
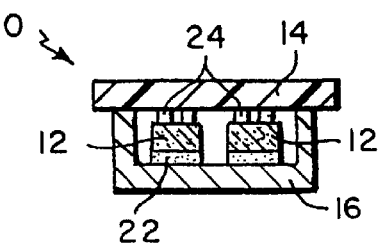

Referring first to FIGS. 1A–1C, a package 10 is shown for one or more IC or other chips 12. The package has three basic elements, a substrate 14 formed of a low moisture permeability thermoplastic material which is preferably liquid crystal polymer (LCP) material, a heat sink 16, formed of a material having good thermal properties and preferably a coefficient of thermal expansion (CTE) which substantially matches that of the chip, and a seal which may take many forms to interconnect and to form a substantially hermetic seal between the substrate and the heat sink. The LCP used for all embodiments is preferably a multiaxially oriented LCP which, for example, has had its multiaxial orientation imported using a coiunter rotating die as taught in at least one of U.S. Pat. No. 5,288,529; 4,966,807; and 4,963,428. Suitable LCP materials include Vectra™ (Hoechst-Celanese), Xydar™ (Amoco), and Zenite™ (DuPont). LCPs and, in particular multiaxially oriented LCP's, have a number of properties which are particularly advantageous in this application. In particular, such LCPs have extremely low permeability (about 1,000 times less than other polymers) to moisture and other gases, and thus, provide hermeticity. Such LCPs can also be designed to match the coefficient of thermal expansion of either leadless ceramic chip carriers or of bare chips, as opposed to most other packaging materials which have higher coefficients of thermal expansion. The coefficient of thermal expansion is controlled by controlling the orientation of the polymers during extrusion, the polymers being oriented during extrusion to achieve the desired CTE which is a function of orientation (see U.S. Pat. No. 4,975,312). The dielectric constant of LCPs is also lower than for any other available substrate material except Teflon, which is difficult to process and expensive. The LCPs also show very low moisture absorption, a property necessary for stable dielectric properties as well as lower dissipation loss at higher frequencies. These excellent properties of such LCP materials combine with the low raw material cost of the polymers to make LCP based packages significantly lower cost than other approaches while offering higher performance.

The heat sink 16 may be a rigid substrate of a metal such as aluminum, ceramic or other material having good thermal properties. For some preferred embodiments, the heat sink is formed of a metal matrix composite or a polymer matrix composite. The coefficient of thermal expansion for the heat sink, which substantially matches that of the chip, is preferably in the range of 2 to 10 PPM/C°. An alternative heat sink design will be discussed later in conjunction with the embodiment of FIG. 3.

FIGS. 1B and 1C illustrate a different technique for forming a seal between the substrate and heat sink. In FIG. 1C heat sink 16 is shown as having a u-shaped configuration in the dimension along the length of the heat sink. The chips are mounted in the space between the side walls of the heat sink and the ends of each side wall are sealed to substrate 14. Such sealing can be by ultrasonic welding, by use of a suitable adhesive or by other techniques known in the art for forming a hermetic seal between the material selected for the heat sink and the LCP material of the substrate. As shown in FIG. 1B, a strip of material which, because of the properties discussed above is preferably an LCP material, is fitted in the u-shaped opening of the heat sink near the end of substrate 14 and is sealed at one end to the substrate and at the other end and its sides to the heat sink by ultrasonic welding, other suitable welding or heat techniques, adhesive or other suitable means for forming a hermetic seal to form an enclosed, hermetically sealed package.

Figure 2A:
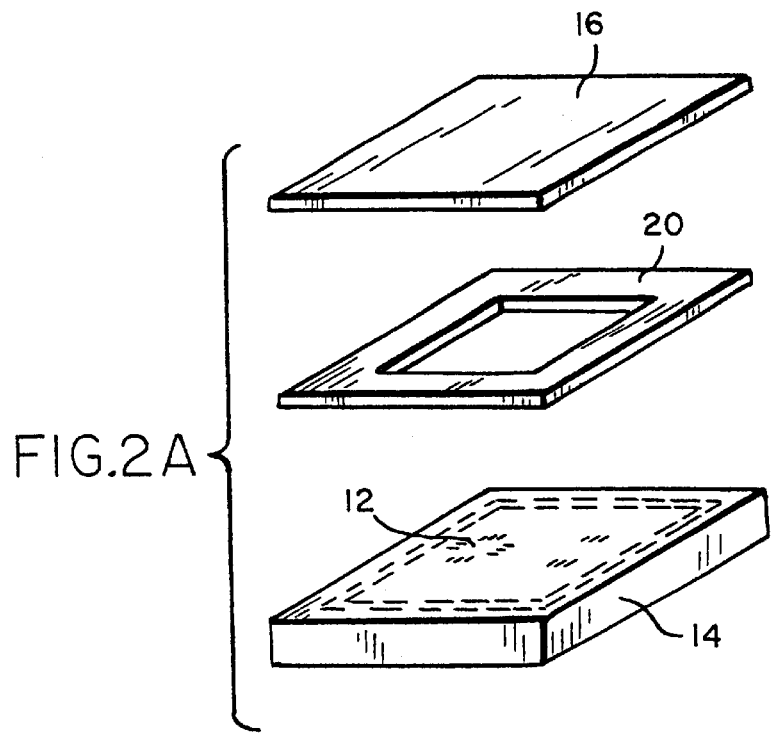
FIG. 2A is an exploded perspective view of a device of the type shown in FIGS. 1A–1C.

FIG. 2A shows another way in which the seal between the substrate 14 and heat sink 16 may be formed. In this embodiment, a picture frame-shape piece of LCP material is mounted between the substrate and heat sink, with the chips 12 being positioned within the frame opening, and the frame 20 is then sealed to both the substrate and heat sink utilizing one or more of the techniques for forming a hermetic LCP to LCP seal, or LCP to heat sink seal. Other techniques for forming the seal will be discussed in conjunction with FIGS. 3 and 4.

Figure 2B:
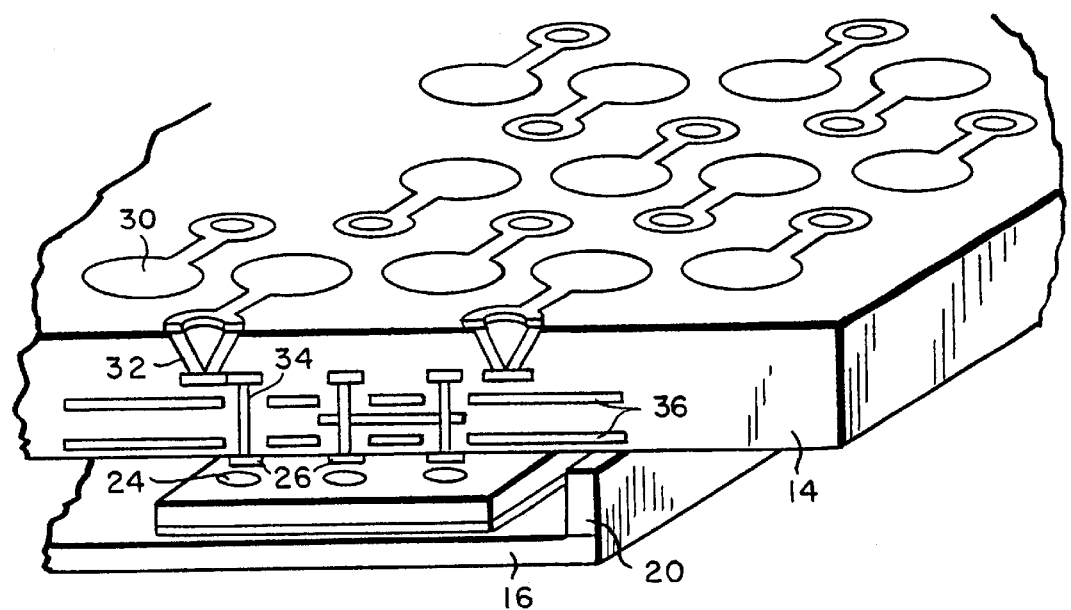
FIG. 2B is an enlarged cross-sectional view of a device of the general type shown in FIG. 1A illustrating the electrical interconnects of the substrate in greater detail.

A die bond or other suitable thermally conductive seal 22 is formed between one side of each IC 12 and heat sink 16. The other side of the IC has solder bumps 24 or other suitable means for making electrical connection to the substrate. FIG. 2B shows one embodiment for interconnect and output wiring of substrate 14, which wiring may be electrically contacted by the solder bumps of chip 12. In FIG. 2B contact points 26 on the surface of the substrate make electrical contact with solder bumps 24. The substrate is a multi-layer LCP having no through vias, with leads or vias 34 extending from each contact point 26. Some leads 34 contact interconnect conductors 36 extending within the substrate. Lead 34, conductors 36 or leads extending from conductors may connect to blind vias 32 which connect to area input/output points 30 on the bottom of the substrate. Some conductors 36 may be used to interconnect chips on a substrate.

Figure 3:
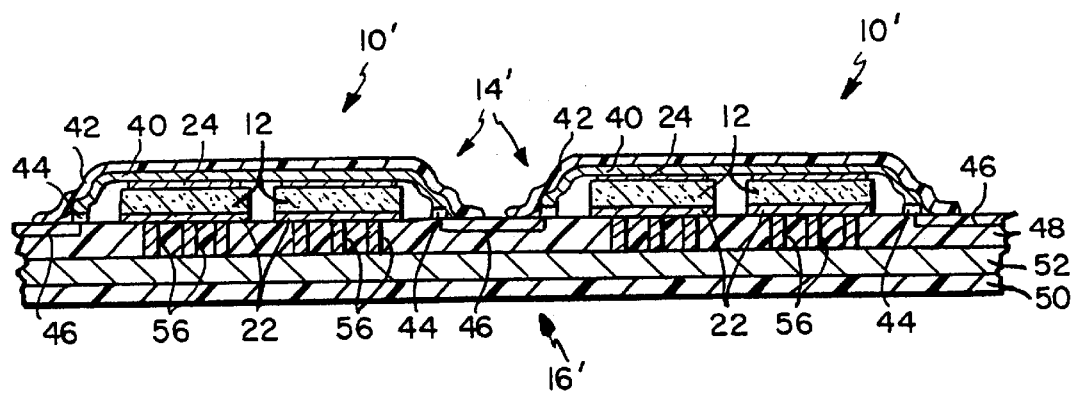
FIG. 3 is a sectional view for an illustrative alternative embodiment of packages in accordance with the teachings of this invention.

FIG. 3 shows an alternative embodiment of the invention which differs from that shown in earlier figures in at least two respects. The first is the manner in which the substrates are sealed to the heat sink, and the second is the nature of the heat sink itself. In particular, each substrate 14' in FIG. 3 is formed of a Vectra™ or other LCP film 42 on which a thin film interconnect pattern 40 has been formed by standard thin film depositing techniques. Interconnect pattern 40 may be of copper, nickel or other conducting metal used in thin film interconnects. Heat sink plate 16' is formed of two Vectra™ or other LCP layers 48 and 50, with a thermally conductive cold plate 54 sandwiched therebetween. Cold plate 54 may be of aluminum or of another metal or other material having good thermal conduction properties. As for prior embodiments, chips 12 are connected to heat sink 16' by thermal die bonds or other suitable thermal conducting bonds 22. Thermal conduction pads 56 are provided through LCP layer 48 between bonds 22 and cold plate 54 to provide a low thermal resistance path for heat from chips 12 to the cold plate. Interconnects 40 are selectively electrically connected to printed circuit pads formed on the surface of LCP layer 48 by screened solder or other suitable electric junctions 44, The pads on the surface of LCP layer 48 are in turn selectively interconnected by printed circuit or other suitable wiring 46 formed on or in LCP layer 48, this layer functioning as a printed wiring board (PWB). As may be seen from FIG. 3, while chips 12 within a single package 10 are interconnected by interconnect wiring 40 formed on substrate 42, packages 10' on printed wiring board/heat sink 16' are interconnected by wiring 46. Wiring 46 may also extend to one or more edges of board 16' to permit this board to be connected either to other boards or other circuitry in a system. The hermetic sealing of each substrate 42 to the LCP surface layer 48 of heat sink/PWB 16' is accomplished by baking and heating layer 42 to form a pinched seal between this substrate and LCP layer 48.

FIGS. 4A–4E illustrate diagramatically the process for forming a single package 10' on PWB 16'. The packages could be formed individually on the PWB or all of the packages on a given PWB could be formed simultaneously.

Figure 4A:
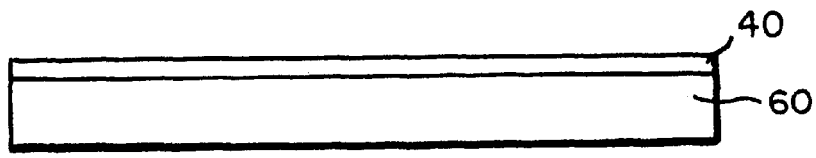
FIGS. 4A–4E are diagrams illustrating various steps in the assembly of a package of the general type shown in FIG. 3.

Referring to FIG. 4A, it is seen that the first step in the operation is to form a Vectra™ or other LCP film on a temporary rigid tool 60. The film 40 would typically be 5 to 10 mil thick.

Figure 4B:
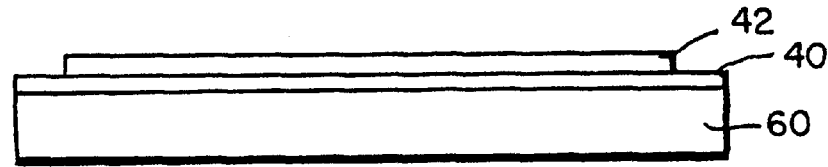
Figure 4C:
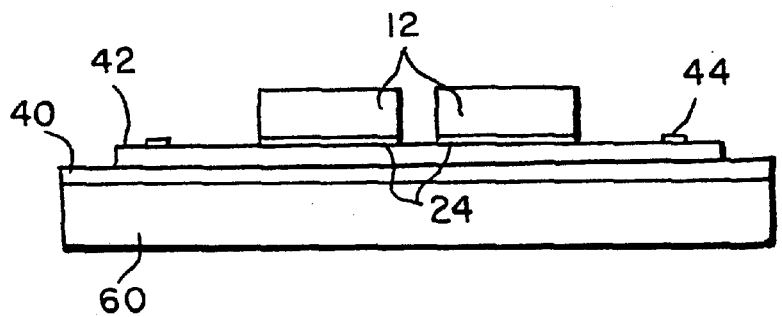
Figure 4D:
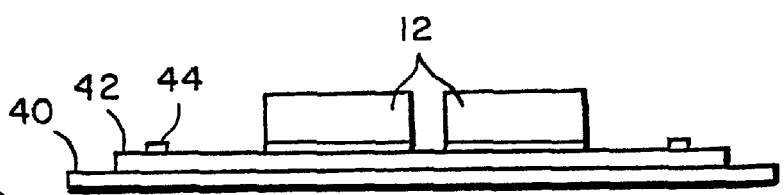
Figure 4E:
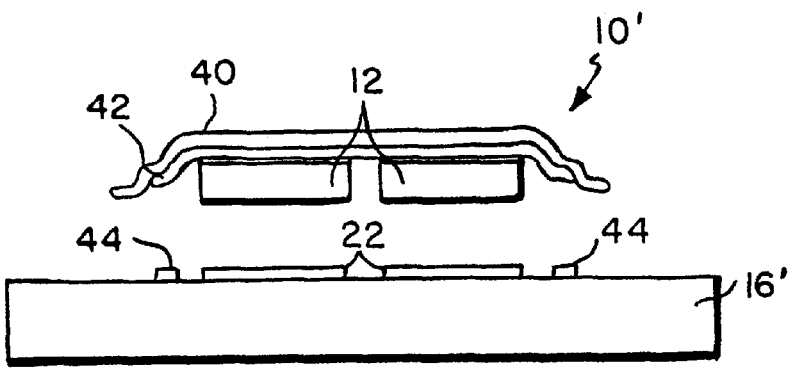

Referring to FIG. 4B, the second step in the operation is to build the high density thin film interconnect 42 on film 40. This would be done using standard thin film interconnect forming techniques. The film would typically be formed of a copper or nickel-topped metal. The next step in the operation is to test the substrates formed as shown in FIG. 4B and select those which are suitable for further assembly. Either before or after the test operation, terminals 44 for soldering are formed on interconnect wiring 42. Chips 12 are then flip-chip bonded to interconnects 42 and the ICs are tested, with defective ICs being replaced (FIG. 4C). FIG. 4D illustrates the heating and removal of tool 60. Finally, FIG. 4E illustrates the flipping and attaching of the subassembly shown in FIG. 4D to PWB 16'. As previously discussed, the ICs are attached to the PWB with thermally conductive material 22, interconnects 42 are gang-bond solder connected at points 44 to wiring on the PWB and the LCP substrates 42 are baked out and heat sealed to the PWB.

Figure 5:
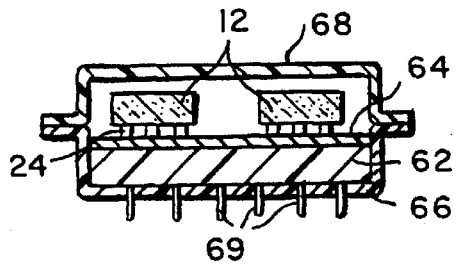
FIG. 5 is a section view for another illustrative alternative embodiment.

FIG. 5 illustrates an alternative illustrative embodiment of the invention which differs from the embodiments previously discussed in several respects. In particular, a substrate 62 having interconnect wiring 64 is provided, which substrate is not necessarily of an LCP material or other polymer material having low moisture permeability. Chips 12 are attached to the interconnect wiring 64 as for prior embodiments. Further, it is assumed that chips 12 are low power devices which do not generate substantial heat and therefore do not require a heat sink. Lid 68 is therefore of a material which provides hermeticity (i.e., low moisture permeability), but not need have good thermal properties. For example, an LCP could be used as the lid 68. Lid 68 may or may not make contact with chips 12 and a thermal bond between the chips and lid 68 is not required.

To achieve hermeticity for the package, an LCP layer or coating 66 is formed over substrate 62 and around output leads 69 from the substrate. The end of LCP layer 66 is sealed to lid 68 by heat welding, ultrasonic welding, or other techniques discussed earlier for forming a hermetic seal.

FIGS. 6A–6e illustrate a microwave embodiment of the invention and a technique for fabricating such embodiment. The unit in these figures consists of an LCP substrate 70 on which microstrip conductors 72 and 76 are formed, conductors 72 and 76 being connected by plated vias 74. For an illustrative embodiment, the width of each conductor 72, 76 is approximately 14 mil to facilitate conduction of microwave signals, and in particular to provide the controlled impedance interconnects required for the conductors of such signals. Substrate 70 serves as a dielectric and may, for example, be approximately be 4 mil thick. LCP substrate 70 is bonded in a manner to be described later to a second LCP layer 78 which has a cut-out 80 formed therein in which IC or chip 12 is bonded, with solder bumps or gold dots 24 making electrical connection with conductor 76. LCP layer 78 and chip 12 are bonded to heat sink 84 which may be a metal such as aluminum, a composite having good thermal and electrical properties, Kovar, or other suitable material. Heat sink 84 is also grounded and serves as the ground plane for the device. This device, as for the devices previously discussed, provides a hermetic enclosure for the chip which is surrounded on all sides except one by LCP material with the LCP material being hermetically sealed to the heat sink which is in contact with the final side of the chip. A microwave package having the desired properties is thus provided.

Figure 6A:
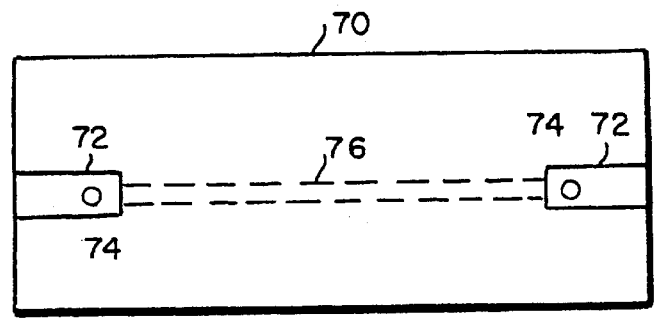
FIGS. 6A–6E are diagrams illustrating the various steps for assembly of a microwave embodiment of the invention.
Figure 6B:
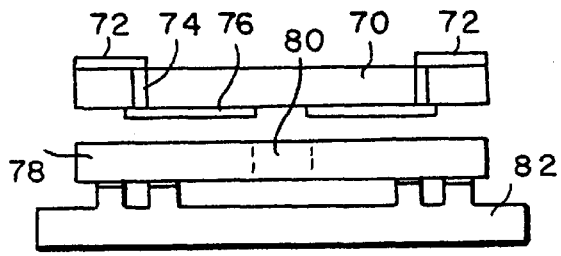
Figure 6C:
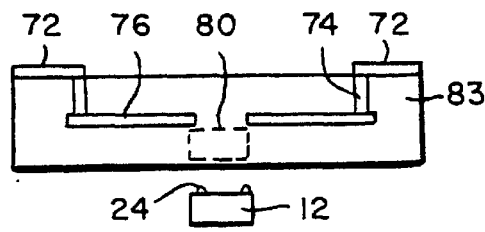
Figure 6D:
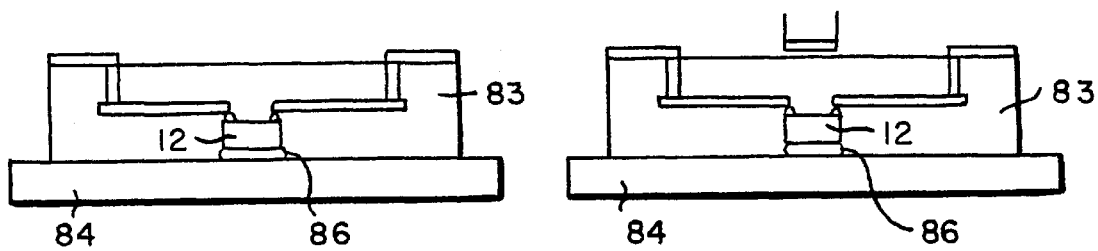
Figure 6E:
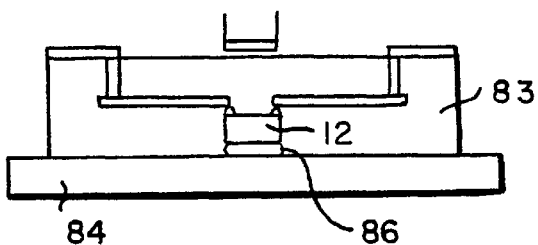

For the method illustrated by FIGS. 6A–6E, the substrate 70 having the interconnects 72, 74 and 76 formed thereon is mounted on top of LCP layer 78 having cut-out 80 formed therein and the LCP layers 70 and 78 are then ultrasonically bonded together (FIG. 6B). The resulting unitary LCP layer 83 has chip 12 fitted into cut-out 80 and solder bumps 24 are then either soldered to conductor 76 (FIG. 6C) or the chip is otherwise bonded in cut-out 80 with bumps 24 in intimate physical and electrical contact with conductor 76 (5C). The assembly 83 formed by the ultrasonic bonding of layers 70 and 78 is then bonded and sealed to heat sink 84 with a suitable bond, for example silver epoxy, with a low thermal resistance die bond 86 also being formed between the chip and the heat sink. Alternatively, the bond between the solder bumps 24 and conductor 76 may be ultrasonically formed (FIG. 6E).

Figure 7A:
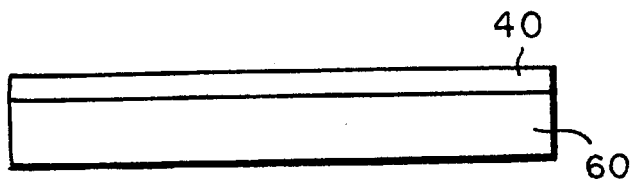
FIGS. 7A–7D illustrate the assembly of an RF implementation of a package in accordance with the teachings of this invention.
Figure 7B:
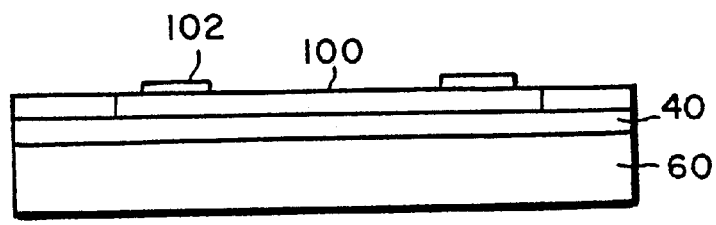

FIGS. 7A–7D illustrate a process for forming an RF package in accordance with the teachings of the invention. The method and package of FIGS. 7A–7D are similar to those of FIGS. 4A–4E and similar reference numbers are therefore used in both figures. In particular, as in FIG. 4A, the first step in the operation is to bond a thin (for example 5 to 10 mil) LCP film (for example Vectra™) 40 to a temporary rigid tool 60. Optionally, a copper foil or film may be provided on the tool before the LCP film is laid down for EMI protection. In FIG. 7B, RF, DC and low frequency interconnects 100 are formed on LCP film 40 and an LCP picture frame 102 is laminated or otherwise formed on substrate 40 and/or interconnects 100.

The substrates are then tested and substrates which pass the test are selected for future assembly.

Figure 7C:
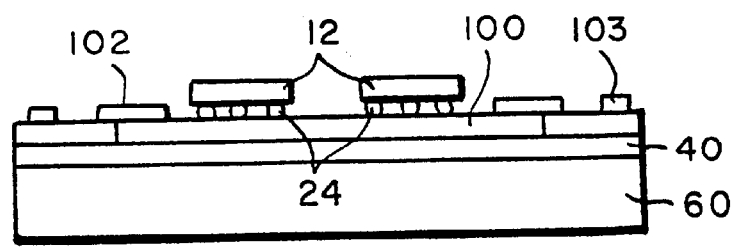
Figure 7D:
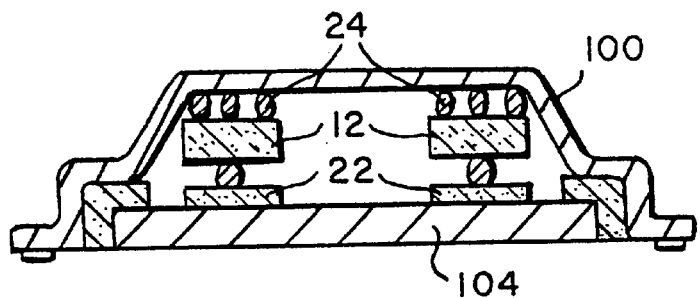

In FIG. 7C, the RF chips 12 are flip-chip bonded to interconnects 100 and I/O terminals 103 are formed at selected points on the ends of the interconnects. The chips are then tested and defective chips replaced. The tool is then heated and removed and the substrate subassembly is flipped and attached to a CTE matched heat sink 104 (FIG. 7D). In particular, the chips are die bonded or otherwise attached to heat sink 104 with a thermally conductive material 22. The LCP picture frame 102 is welded or baked out to form the hermetic seal between substrate 40 and heat sink 104.

Terminals 103 are available to interconnect the package to a PCB or other suitable circuit.

Figure 8A:
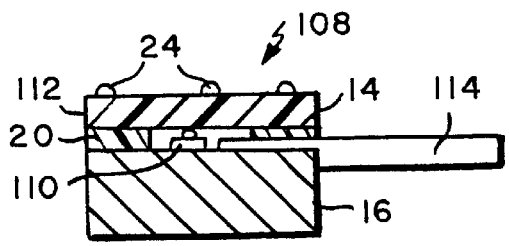
FIG. 8A is a cutaway view of an optical circuit package.
Figure 8B:
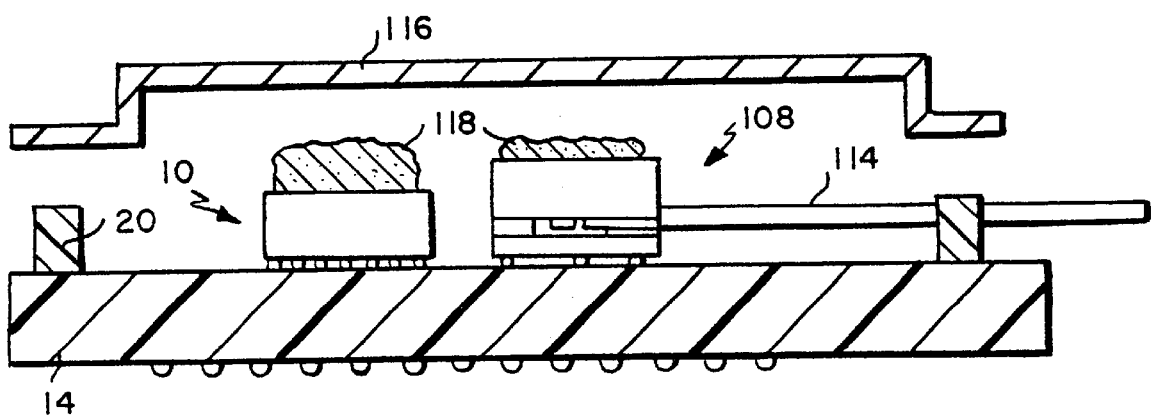
FIG. 8B is a cutaway, partially exploded view of a package in accordance with the teachings of this invention for an optical package of the type shown in FIG. 8A.
Figure 8C:
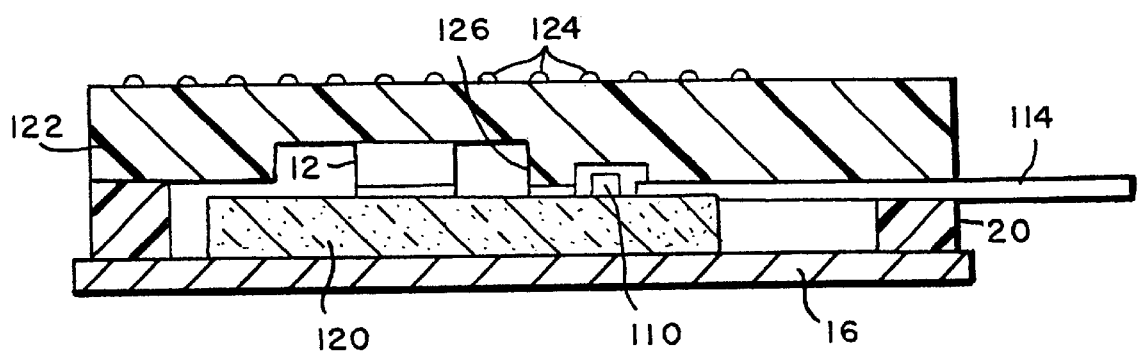
FIG. 8C is a cutaway view of an alternative optical package in accordance with the teachings of this invention.

FIGS. 8A–8C illustrate two different optical embodiments of the invention (i.e., a package which contains at least one optical component). In particular, in FIG. 8A a first optical package is formed which includes a laser array 110 which is the chip for this package. The laser array is thermally connected to a heat sink layer 16 with, for example, thermally conductive paste, and is electrically connected, for example by solder 112, to an LCP substrate 14. The LCP substrate and the heat sink are sealed together, for example by an LCP picture frame 20, and an optical fiber or fiber array 114 is provided to output optical signals from the laser. The fiber is embedded in proper alignment with laser array 110 in a groove formed in heat sink 16 and also fits in a groove formed in picture frame 20. The two grooves between which the fiber is seated serve to secure the fiber in proper alignment with laser 110 when the seal is formed between the picture frame and the heat sink. Alternatively, the groove in which fiber 114 is mounted could be formed in LCP layer 14, rather than heat sink 16, or grooves could be provided in either the heat sink or the substrate with the fiber 114 passing through a hold in frame 20. Since no mechanical stresses are applied to the fiber during the sealing operation, the critical alignment between the laser and fiber is maintained.

FIG. 8B illustrates a package in which an optical package of the type shown in FIG. 8A may be further packaged. In this package, the package 108 and a package 10 containing a chip with circuitry for controlling the laser array 112 are mounted to an LCP substrate 14 of the type previously described and are flip chip connected to this substrate, also in the manner previously described. A heat sink 116 of a CTE matched high thermal conductivity material, such as aluminum or copper, is attached to packages 10 and 108 through a thermally conductive paste 118. Fiber 114 passes through a groove or hole in LCP frame or ring 20 and is sealed in the ring. The package is completed by ultrasonically or otherwise sealing heat sink lid 116 to LCP frame 20.

FIG. 8C shows an alternative embodiment wherein both the laser array and the control IC therefor are mounted within a single package. For this embodiment, a silicon wafer board 120 is provided which serves as the platform to which both laser 110 and silicon IC or chip 12 are mounted and through which these devices are electrically interconnected. Fiber 114 fits in a channel formed in LCP substrate 122, which substrate has solder bumps 124 for interconnecting the package to a PWB or other circuitry. Fiber array 114 also passes through a groove or opening in LCP picture frame 20 and is therefore sealed in a desired alignment when the substrate and frame are sealed together in the manner previously described. Both chip 12 and laser array 110 are electrically connected to the LCP substrate which also makes electrical contact to wafer board 120 through solder bumps 126. Chip 12 and laser 110 are thermally bonded to wafer board 120 and the wafer board chip is thermally bonded to heat sink 16. Heat from the chip and the laser thus pass through the wafer board to the heat sink for removal from the package. A hermetically sealed package in accordance with the teachings of this invention is thus provided for optical components.

Figure 9A:
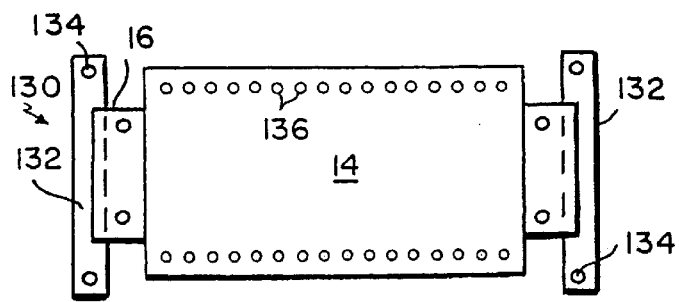
FIGS. 9A, 9B and 9C are a top view, cross-sectional side view, and cross-sectional end view, respectively of a three-dimensional stacked array of packages of the type shown in FIG. 1.
Figure 9C:
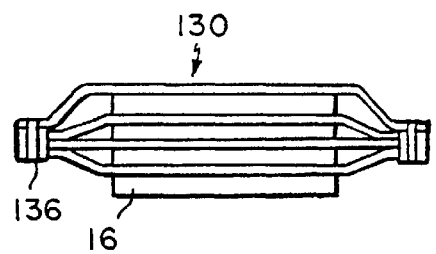
Figure 9B:
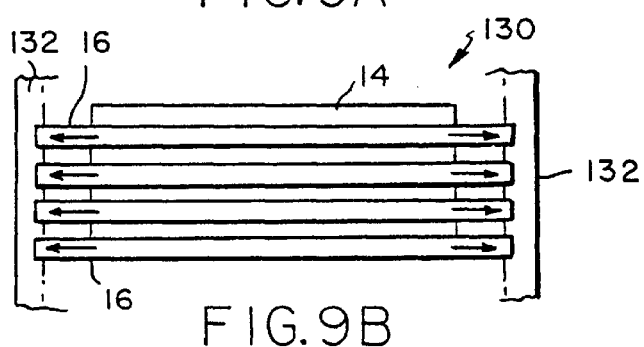

In the discussion so far, varying numbers of chips 12 have been packaged in a single package 10 (10', 110, etc.). FIGS. 9A–9C illustrate one way in which a plurality of such packages may be stacked to form a high density 3D package 130.

Referring to the figures, it is seen that the heat sink 16 for each package 10 is connected at each end to a heat sink frame or plate 132. If desired, coolant air or liquid may be pumped through channels 134 formed in each of the plates 132 to enhance heat remover from the packages. Other techniques known in the art may also be utilized to enhance heat removal.

Holes are drilled along edges of each substrate which extend beyond the sides of the heat sinks 16. The holes are plated through to form small vias 136, which may then be pinched together and interconnected as shown in FIG. 9C to electrically interconnect the packages. Frames or plates 132 interacting with heat sinks 16 and screws or other suitable connectors through selected vias 136 hold the package 130 together as a single, unitary, 3D stack. A particular advantage of the configuration shown in FIGS. 9A–9C is that the thermal and electrical paths are at right angles to each other, minimizing interference between these two functions.

Figure 10A:
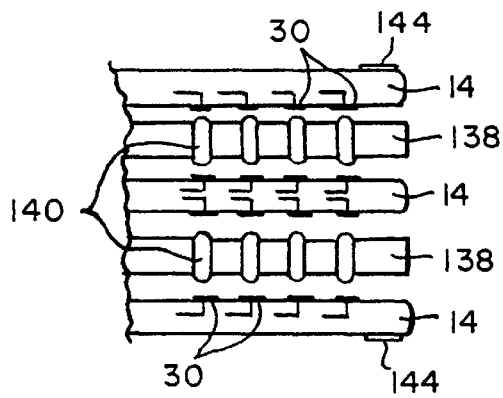
FIGS. 10A, 10B and 10C are enlarged views illustrating three different options for electrically interconnecting the packages in a 3D array of stacked packages.
Figure 10B:
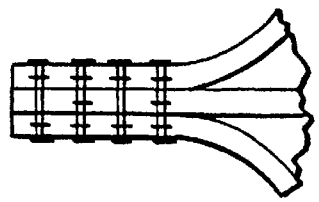
Figure 10C:
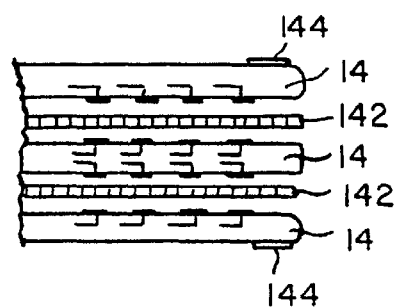
Figure 11:
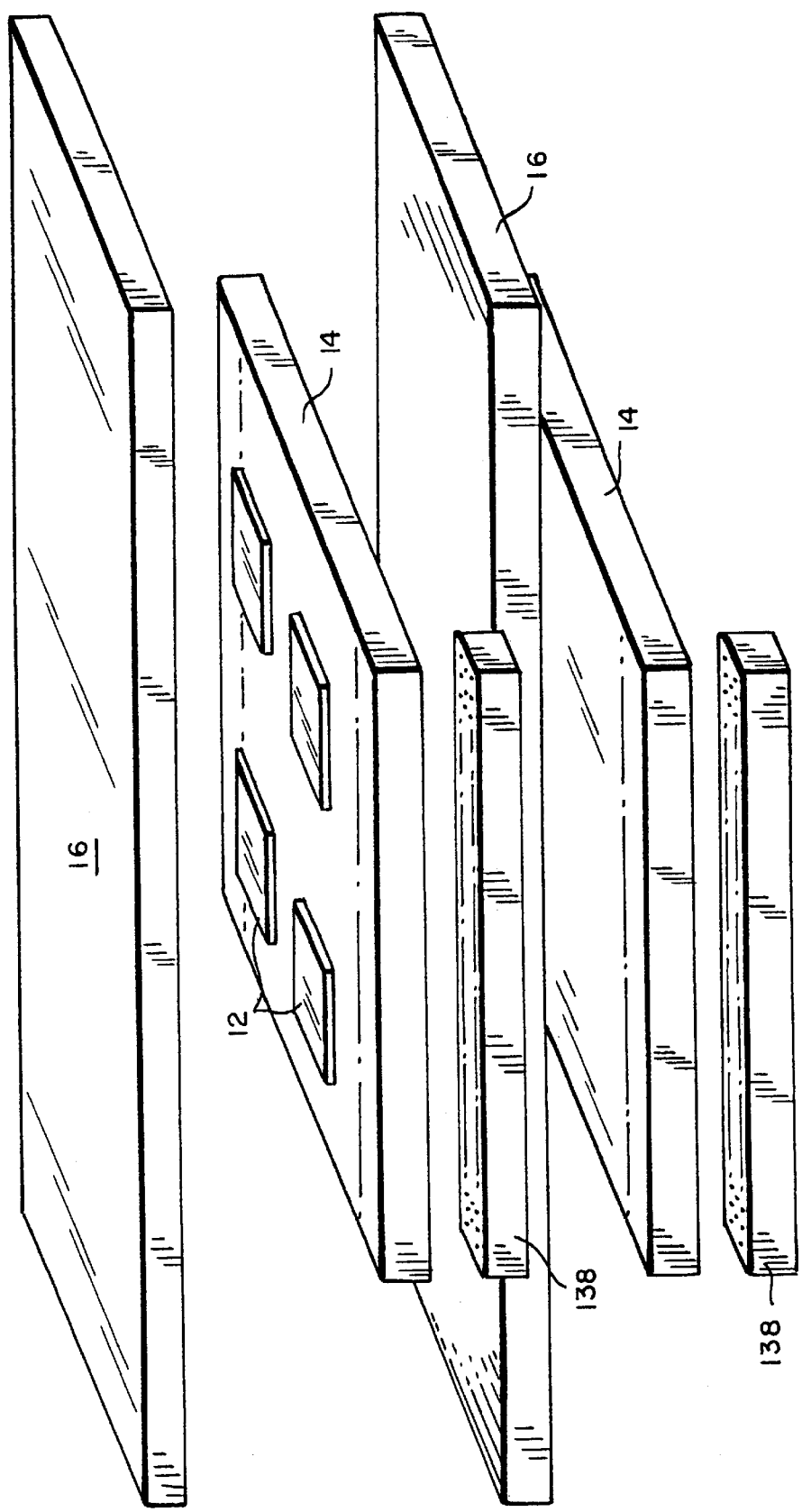
FIG. 11 is an exploded view of several elements in a 3D stacked array which is interconnected in a manner shown in FIG. 10A.

FIGS. 10A–10C illustrate three possible ways in which electrical interconnects between the substrates 14 for the packages may be accomplished. FIG. 10B further illustrates the technique shown in FIG. 9C wherein plated through vias are used for the interconnects. In FIG. 10A button boards 138 are provided between adjacent substrates 14 to effect electrical connection therebetween. Each substrate 14 has I/O pads 30 on one side thereof for end substrates and on both sides thereof for the center substrate, which make pressure contact with buttons 140 on the button board to interconnect the circuitry of the substrates. Either conductive pads or buttons may be missing at places where interconnects are not desired. FIG. 10C is similar to and operates in substantially the same way as the embodiment of FIG. 10A except that elastomeric connectors 142 perform the electrical interconnect function between adjacent substrates rather than button boards 138. Edge connector pads 144 are provided for the embodiments of both FIGS. 10A and 10C to permit electrical connection of the 3D stacked package to other circuitry. A suitable clamping device (not shown) could be used to hold the stacks together for the embodiments of FIG. 10A or 10C. Alternatively, the function of holding the stack together could be performed solely by the frame 132 (FIG. 9B). FIG. 11 is an exploded view illustrating a 3D stack which is interconnected utilizing the button boards 138 of FIG. 10A.

While the invention has been particularly shown and described above with reference to various package embodiments including embodiments suitable for use with microwave, RF and optical components, and various techniques have been shown for forming individual packages into a 3D stacked array, and while various alternatives have been discussed throughout for the embodiments shown, it is apparent that other modifications could be made in the invention by one skilled in the art while still remaining within the spirit teachings of the invention. In particular, while multiaxially oriented LCP material is the preferred material throughout the application where LCP material has been called for, it is possible that other LCP or other thermoplastic materials having low moisture permeability may be used at each place where an LCP material is called for. Further, while FIG. 5 illustrates that two layers of LCP material may hermetically seal together a package which includes a substrate, such seal might also be formed by a single piece of LCP material formed around the package. It is also possible that LCP material could be utilized to form a hermetic seal about a single chip or other electronic components such as a resistor or capacitor with solder bumps or leads extending through the LCP coding or layer in the manner shown and discussed with respect to FIG. 5. The invention is therefore to be limited only by the scope of the following claims.

What is claimed is:

1. A semiconductor chip package comprising:
   a substrate which includes at least a layer of a liquid crystal polymer (LCP) material;
   electrical interconnects formed on said substrate;
   at least one semiconductor chip bonded on at least a first side to selected ones of the electrical interconnects;
   a lid; and
   a hermetic seal formed around the at least one semiconductor chip between the substrate and the lid.

2. A package as claimed in claim 1 wherein the lid is a heat sink, and including a thermal bond between a second side of each chip and the heat sink.

3. A package as claimed in claim 2 wherein the heat sink is formed at least in part of a liquid crystal polymer (LCP).

4. A package as claimed in claim 3 wherein the heat sink is a printed wiring board (PWB) which includes a cold-plate sandwiched between a pair of LCP layers, and thermal conduction pads extending from each thermal bond, through an adjacent LCP layer, to said cold-plate.

5. A package as claimed in claim 2 wherein said seal formed between the substrate and the heat sink is a pinch seal.

6. A package as claimed in claim 5 wherein the heat sink is a PWB having electrical wiring thereon, and including electrical connections between the interconnects on the substrate and the electrical wiring on the PWB.

7. A package as claimed in claim 2 wherein the substrate is formed of an LCP material, wherein the seal between the substrate and the heat sink includes at least one LCP interconnect element between the substrate and the heat sink, a seal between the at least one interconnect element and the substrate, and a seal between the at least one interconnect element and the heat sink.

8. A package as claimed in claim 7 including a signal conducting element passing through and sealed in said interconnect element.

9. A package as claimed in claim 2 wherein said heat sink is formed of a material having a coefficient of thermal expansion (CTE) of two to ten ppm/C°.

10. A package as claimed in claim 2 wherein the material for the heat sink is at least one of a metal matrix composite and a polymer matrix composite.

11. A package as claimed in claim 2 wherein the heat sink is formed of a machinable material, the heat sink being bent to form a cavity in which the chips fit, the edges of the heat sink being sealed to the substrate.

12. A package as claimed in claim 1 wherein the substrate has an external layer of an LCP material, said external LCP layer being hermetically sealed to the lid.

13. A package as claimed in claim 1 wherein said substrate is formed of an LCP material.

14. A package as claimed in claim 13 wherein the LCP material is a multiaxially oriented LCP material.

15. A package as claimed in claim 13 wherein the LCP material is Vectra™.

16. A package as claimed in claim 13 wherein the seal between the substrate and the heat sink includes at least one LCP interconnect element between the substrate and the heat sink, a seal between at least one interconnect element and the substrate, and a seal between at least one interconnect element and the heat sink.

17. A package as claimed in claim 1 wherein said at least one chip operate in at least one of the RF and microwave bands.

18. A package as claimed in claim 17 wherein the interconnects on the substrate are controlled impedance interconnects suitable for operation in the frequency band of the at least one chip.

19. A package as claimed in claim 1 wherein said at least one chip includes optical components, and including optical fibers sealed into said package and aligned with corresponding optical components to transmit light in at least one direction to and from said component.

20. A package as claimed in claim 19 wherein said optical fibers are sealed into said substrate.

21. A package as claimed in claim 19 wherein said components are at least one of optical detectors and optical emitters.

22. A package as claimed in claim 1 wherein a plurality of said packages are stacked to form a 3-D array; and including means for physically and electrically connecting said packages.

23. A package as claimed in claim 22 wherein said stacked packages each have an overhang, the overhangs of adjacent packages being physically connected by at least one of heat seal, adhesive, clamps and screws.

24. A package as claimed in claim 23 including plated through holes in said overhangs for making electrical connections between packages.

25. A package as claimed in claim 23 wherein the substrate and the heat sinks for said package have overhangs at 90° to each other, whereby the electrical paths and thermal paths for each package are at 90° to each other.

26. A package as claimed in claim 1 wherein said substrate is a multilayer substrate with no through holes.

27. A chip package comprising:

a substrate formed of a liquid crystal polymer (LCP);

electrical interconnects formed on said substrate;

a plurality of semiconductor chips each having at least a first side bonded to at least selected ones of the electrical interconnects;

a heat sink;

a thermal bond between a second side of each chip and the heat sink; and a hermetic seal formed around the chips between the substrate and the heat sink.

* * * * *